(12) United States Patent
Ejiri

(10) Patent No.: US 6,815,222 B2
(45) Date of Patent: Nov. 9, 2004

(54) METHOD FOR PROTECTING CAPACITIVE ELEMENTS DURING PRODUCTION OF A SEMICONDUCTOR DEVICE

(75) Inventor: Hirokazu Ejiri, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/192,365

(22) Filed: Jul. 10, 2002

(65) Prior Publication Data

US 2003/0022433 A1 Jan. 30, 2003

(30) Foreign Application Priority Data

Jul. 11, 2001 (JP) ........................................ 2001-210403

(51) Int. Cl.$^7$ ..................... H01L 21/00; H01L 21/8242
(52) U.S. Cl. ........................ 438/3; 438/240; 438/396
(58) Field of Search .......................... 438/3, 239–240, 438/253–256, 396

(56) References Cited

U.S. PATENT DOCUMENTS 6,075,691 A * 6/2000 Duenas et al. ........... 361/321.5
6,483,142 B1 * 11/2002 Hsue et al. ................. 257/306
6,524,868 B2 * 2/2003 Choi et al. ...................... 438/3
6,533,948 B2 * 3/2003 Kato et al. ...................... 216/6
6,576,526 B2 * 6/2003 Kai et al. .................... 438/393

* cited by examiner

Primary Examiner—Thanh Nguyen
(74) Attorney, Agent, or Firm—Robert J. Depke; Holland & Knight LLP

(57) ABSTRACT

Disclosed is a method for production of a semiconductor device having capacitive elements. The method includes steps of covering an insulating film formed on a substrate sequentially with a lower electrode film, a dielectric film, and an upper electrode film; applying a photoresist to the top of the films in laminate structure by photolithography, thereby forming a photoresist pattern to form an upper electrode; performing selective etching on the upper electrode film by using the photoresist pattern to form the upper electrode as a mask, thereby forming the upper electrode pattern; covering the upper electrode pattern with a photoresist pattern to form a dielectric pattern; and performing selective etching on the dielectric film by using the photoresist pattern to form the dielectric as a mask, thereby forming the dielectric pattern. The above-mentioned production method prevents a short circuit between the upper electrode and the lower electrode when the capacitive element is formed.

8 Claims, 13 Drawing Sheets

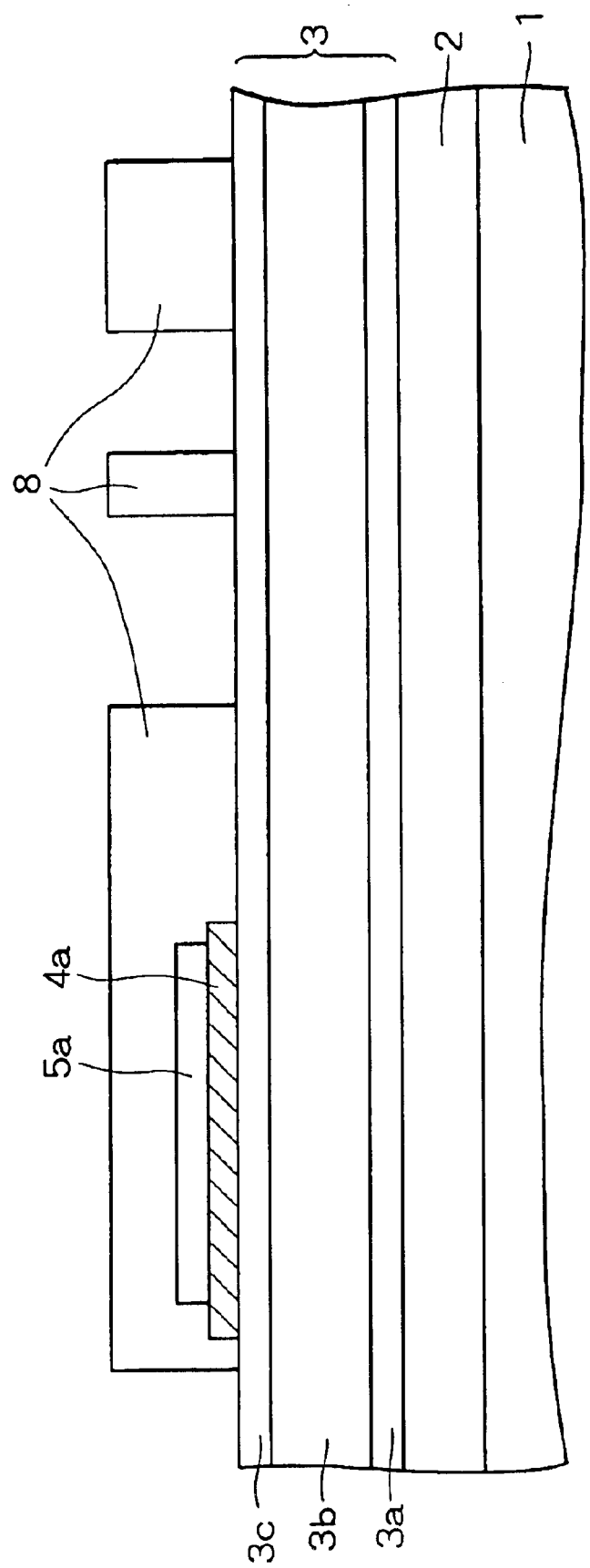

METHOD FOR PROTECTING CAPACITIVE ELEMENTS DURING PRODUCTION OF A SEMICONDUCTOR DEVICE

This application claims priority to Japanese Patent Application Number JP2001-210403 filed Jul. 11, 2001 which is incorporated herein by reference.

BACKGROUND OF THE INVENTION

The present invention relates to a method for production of a semiconductor device. More particularly, the present invention relates to a method for production of a semiconductor device with capacitive elements formed therein.

The recent trend in electronic machines and equipment is toward size reduction and weight reduction. Under this state, semiconductor devices used in electronic machines and equipment are required to carry out many functions individually, and hence each semiconductor device has various electronic elements formed therein. Among these electronic elements is a capacitive element or capacitor of MIM (Metal Insulator Metal) structure.

A conventional technology to form a capacitor of MIM structure in a semiconductor device includes a step of sequentially forming on a semiconductor substrate a lower electrode film, a dielectric film, and an upper electrode film, a step of forming a resist pattern conforming to the desired figure of the capacitor, and a step of performing etching.

FIGS. 13A to 13C are sectional views showing step by step the conventional method for producing a semiconductor device with a capacitive element formed therein. FIG. 13A is to sequentially form on a semiconductor substrate an insulating film, a lower electrode film, a dielectric film, and an upper electrode film. FIG. 13B, which follows FIG. 13A, is to form a resist pattern on the upper electrode film which becomes the upper electrode later. FIG. 13C, which follows FIG. 13B, is to form the upper electrode pattern and the dielectric pattern by etching.

FIG. 13A shows that a semiconductor substrate 20 is sequentially coated with an insulating film 21 of silicon oxide ($SiO_2$) or the like, a lower electrode film 22, a dielectric film 23, and an upper electrode film 24.

FIG. 13B shows that the upper electrode film 24 is coated with a photoresist, which is made into a photoresist pattern 25 later.

FIG. 13C shows that the upper electrode film 24 and the dielectric film 23 simultaneously undergo etching such as RIE (reactive ion etching) through the photoresist pattern 25 as a mask. Thus, there are formed an upper electrode pattern 24a and a dielectric pattern 23a.

The conventional technology mentioned above has, however, the disadvantage of causing overetching. Overetching is a phenomenon that etching to work the upper electrode film 24 and the dielectric film 23 undesirably affects the lower electrode film 22. The result of overetching is sputtering, which is a phenomenon that the constituents of the lower electrode film 22 are driven out and scattered, as indicated by the arrow A in FIG. 13C. Scattered particles deposit on the side walls of the upper electrode pattern 24a and the dielectric pattern 23a, and the upper surface of the lower electrode film 22. They form the conductive deposit 26 which short-circuits an upper electrode pattern 24a to the lower electrode film 22.

SUMMARY OF THE INVENTION

The present invention was completed in view of the foregoing. It is an object of the present invention to provide a method for production of a semiconductor device which avoids a short circuit between the upper and lower electrodes in its step of forming capacitive elements.

According to an aspect of the present invention, there is provided a method for production of a semiconductor device having capacitive elements including:

a step of forming a lower electrode film on an insulating film formed on a substrate;

a step of forming a dielectric film on the lower electrode film;

a step of forming an upper electrode film on the dielectric film;

a step of forming a pattern to form an upper electrode pattern of the capacitive elements on the upper electrode film;

a step of etching the upper electrode film by using the pattern to form the upper electrode pattern as a mask;

a step of forming a pattern to form a dielectric pattern for the capacitive element such that it includes the upper electrode pattern; and a step of etching the dielectric film by using the pattern to form the dielectric pattern as a mask.

According to the production method mentioned above, the resist pattern to form the dielectric pattern is so formed as to cover the upper electrode pattern. Therefore, this resist pattern protects the upper electrode from deposit of the constituents of the lower electrode film which are scattered by sputtering action when the dielectric film undergoes etching.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 2 is a sectional view showing the step following that in FIG. 1D in the production of a semiconductor device according to the method of the present invention.

DETAILED DESCRIPTION OF THE PREFERRED EMBODIMENTS

The invention will be described in more detail with reference to the accompanying drawings.

FIGS. 1A to 12 are sectional views showing step by step the method for production of the semiconductor device pertaining to the embodiment of the present invention.

Figure 1A:
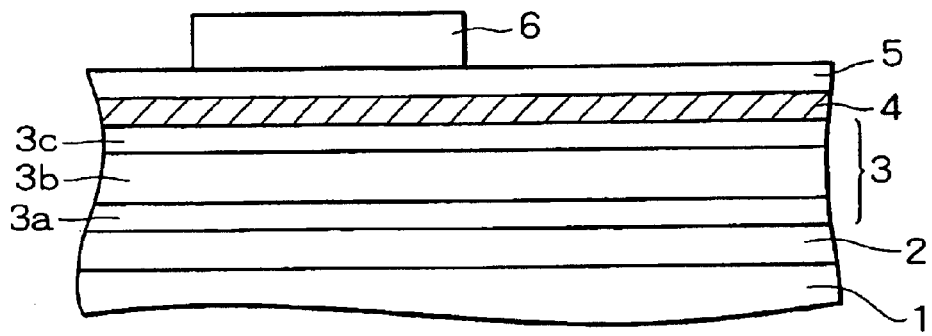
FIGS. 1A to 1D are sectional views showing step by step the method for producing a semiconductor device according to one embodiment of the present invention.
Figure 1B:
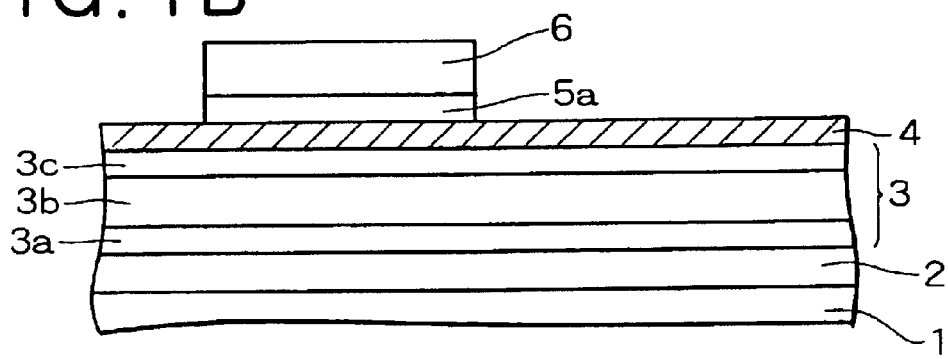
Figure 1C:
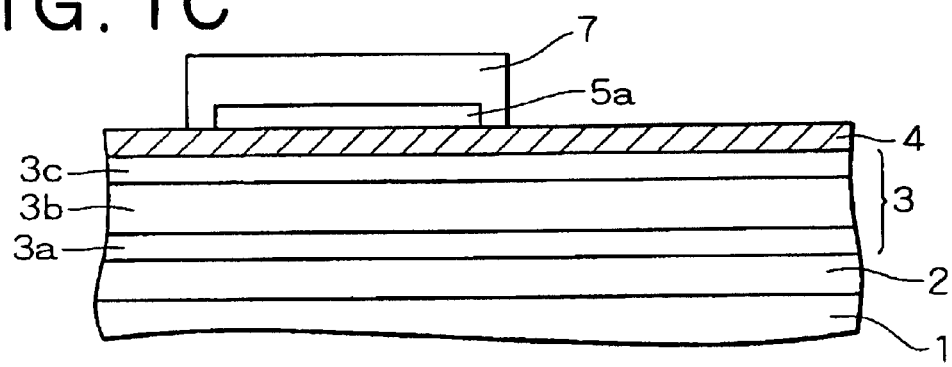
Figure 1D:
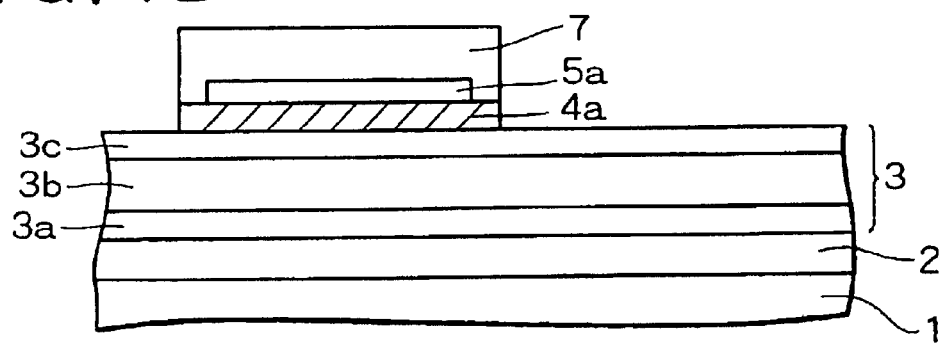

FIGS. 1A to 1D are sectional views showing steps for forming a capacitive element in the production of a semiconductor device. FIG. 1A shows a step for forming a photoresist pattern to work the upper electrode. FIG. 1B shows a step, following that in FIG. 1A, for forming the upper electrode pattern by etching. FIG. 1C shows a step, following that in FIG. 1B, for forming a photoresist pattern to work the dielectric. FIG. 1D shows a step, following that in FIG. 1C, for forming a dielectric pattern by etching the dielectric film.

Steps shown in FIG. 1A include sequentially forming on a semiconductor substrate 1 an insulating film 2, a lower electrode film 3, a dielectric film 4, and an upper electrode film 5, and coating with a photoresist which is finally made into a photoresist pattern 6 to work the upper electrode.

In this embodiment, the semiconductor substrate 1 is covered with the insulating film 2 of $SiO_2$.

The insulating film 2 is covered with the lower electrode film 3, which is composed of a lower layer 3a as a barrier metal, a metal layer 3b, and an upper layer 3c as an antireflection film. The lower layer 3a is formed from titanium (Ti), a mixture of titanium and titanium nitride (TiN), or titanium oxide nitride (TiON). The metal layer 3b is formed from aluminum (Al) alloy, and it is preferably 300 to 1000 nm thick. The upper layer 3c is formed from TiN, and it is preferably 10 to 80 nm thick.

The lower electrode film 3 is covered with the dielectric film 4. The dielectric film 4 is formed from tantalum oxide ($Ta_2O_5$), and it is preferably 10 to 80 nm thick. It is formed by CVD (chemical vapor deposition) PE-CVD (plasma enhanced CVD), or sputtering. Prior to formation of the dielectric film 4, the lower electrode film 3 may undergo surface treatment by plasma irradiation or wet process according to need.

The dielectric film 4 is covered with the upper electrode film 5. The upper electrode film 5 is formed from a metal or compound, such as TiN, which is not oxidized by $Ta_2O_5$, or from ruthenium (Ru) which retains conductivity even though it is oxidized.

The upper electrode film 5 is covered with the photoresist, which is subsequently made into the photoresist pattern 6 by etching. The photoresist pattern 6 is used to work the upper electrode.

The step shown in FIG. 1A is followed by the step shown in FIG. 1B, which includes etching the upper electrode film 5, thereby forming the upper electrode pattern 5a.

This etching employs the photoresist pattern 6 as a mask so as to remove the upper electrode film 5 except for its masked part. In this way the upper electrode pattern 5a is formed.

The step shown in FIG. 1B is followed by the step shown in FIG. 1C, which includes forming a photoresist pattern 7 which covers the upper electrode pattern 5a.

In FIG. 1C, the photoresist pattern 6, which has been used for etching in FIG. 1B, is removed, and subsequently the upper electrode pattern 5a and the dielectric film 4 are covered with a photoresist. Then, etching is performed such that the photoresist pattern 7 covers the upper electrode pattern 5a.

The step shown in FIG. 1C is followed by the step shown in FIG. 1D, which forms the dielectric pattern 4a.

In FIG. 1D, etching such as RIE that uses the photoresist pattern 7 as a mask is performed on the dielectric film 4. In this way the dielectric pattern 4a is formed.

It is to be noted that when the dielectric pattern 4a is formed from the dielectric film 4 by etching, the upper electrode pattern 5a is covered by the photoresist pattern 7. Therefore, the upper electrode pattern 5a is protected from deposition of conductive contaminants, such as titanium deriving from overetching, evolved from the lower electrode film 3 by sputtering. The result is that there is no short circuit between the upper electrode pattern 5a and the lower electrode film 3 for the capacitive element.

The following explains the steps of forming the capacitive element pattern, the wiring pattern, and the second wiring layer.

FIG. 2 is a sectional view showing the step that follows the step shown in FIG. 1D. The step shown in FIG. 2 is intended to form a photoresist pattern 8 which was used to form the capacitive element pattern and the wiring pattern.

The step shown in FIG. 2 includes removing the photoresist pattern 7, which was used as a mask when the dielectric film 4 underwent etching in the step shown in FIG. 1D, applying a photoresist onto the lower electrode film 3, the dielectric pattern 4a, and the upper electrode pattern 5a, and performing etching on the photoresist such that it covers the dielectric pattern 4a and the upper electrode pattern 5a and it also covers part of the lower electrode film 3. In this way there is obtained the photoresist pattern 8.

Figure 3:
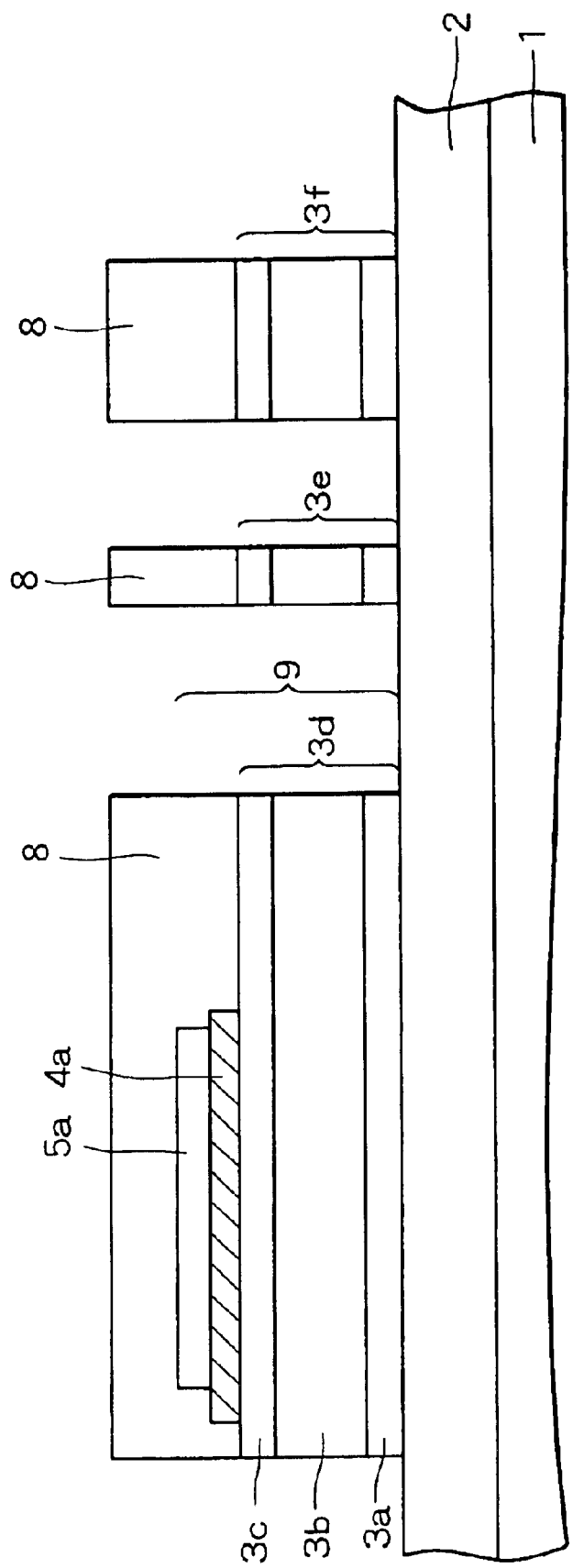
FIG. 3 is a sectional view showing the step following that in FIG. 2 in the production of a semiconductor device according to the method of the present invention.

FIG. 3 is a sectional view showing the step that follows the step shown in FIG. 2. In this step, the capacitive element pattern 9 and the wiring patterns 3e and 3f are formed.

In this step, etching such as RIE that uses the photoresist pattern 8 as a mask is performed on the lower electrode film 3 so as to form the capacitive element pattern 9 and the wiring patterns 3e and 3f. The capacitive element pattern 9 includes the lower electrode pattern 3d, the dielectric pattern 4a, and the upper electrode pattern 5a.

Figure 4:
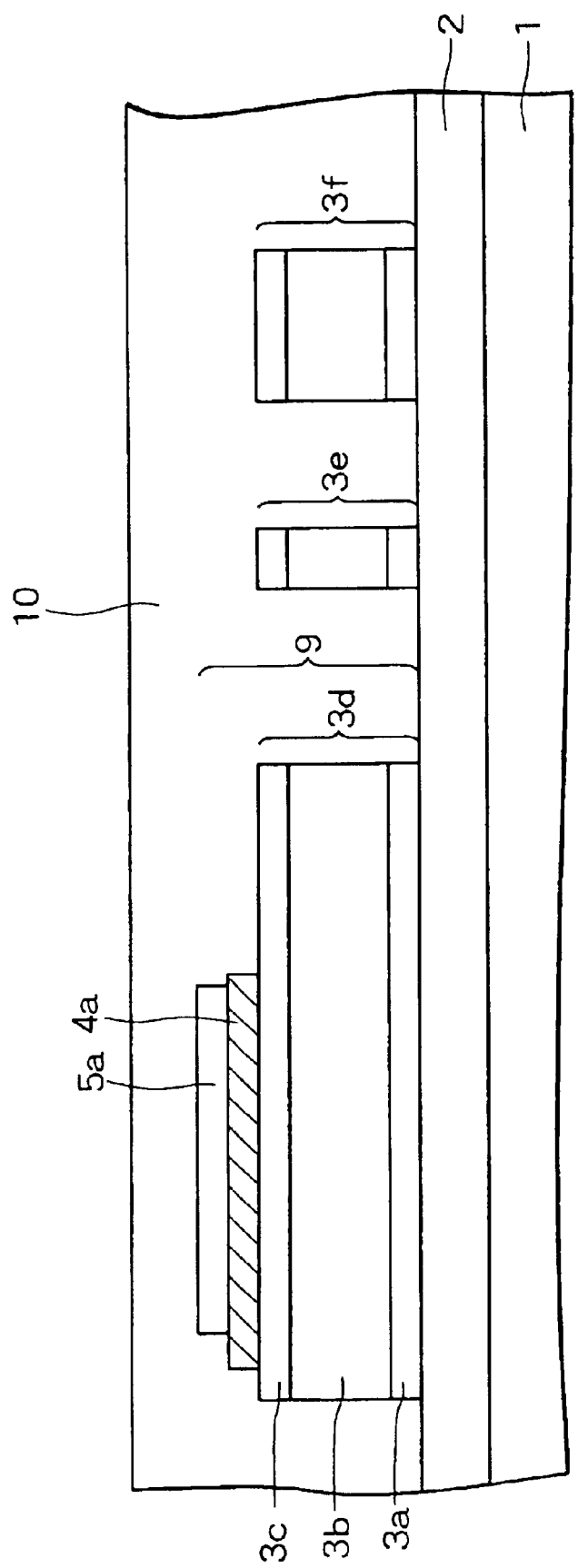
FIG. 4 is a sectional view showing the step following that in FIG. 3 in the production of a semiconductor device according to the method of the present invention.

FIG. 4 is a sectional view showing the step that follows the step shown in FIG. 3. In this step, an interlayer insulating film 10 that provides insulation between wirings is formed.

In this step, the photoresist pattern 8, which was used for the etching of the lower electrode film 3, is removed. Then, the interlayer insulating film 10 of $SiO_2$ or the like is formed on the capacitive element pattern 9 and the wiring patterns 3e and 3f. Moreover, since the second wiring layer is to be formed on the interlayer insulating film 10 in the later step, the interlayer insulating film 10 is planarized by CMP (chemical mechanical polishing) or the like. This is because any difference in level on its surface would result in thin wiring which is liable to breakage.

Figure 5:
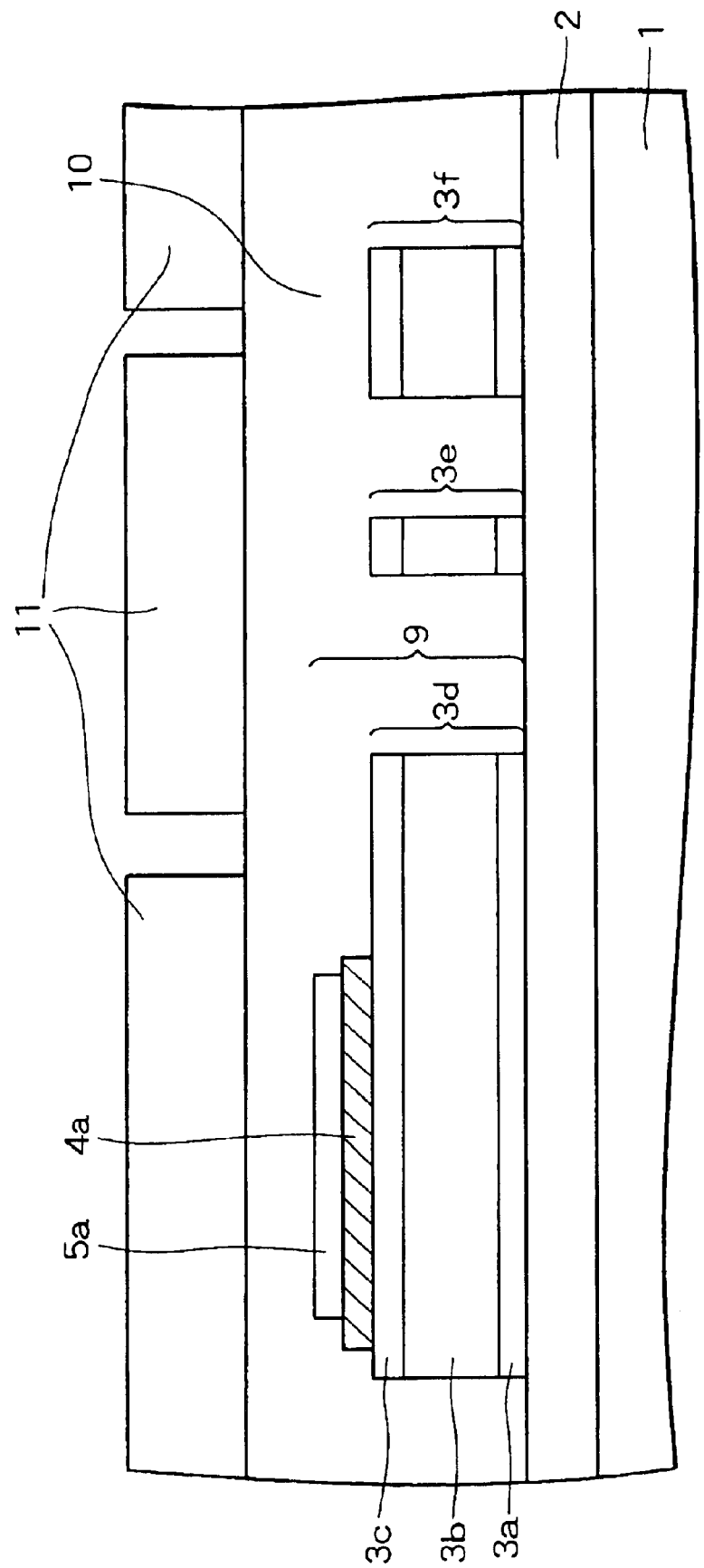
FIG. 5 is a sectional view showing the step following that in FIG. 4 in the production of a semiconductor device according to the method of the present invention.

FIG. 5 is a sectional view showing the step that follows the step shown in FIG. 4. In this step, the resist pattern 11 for via holes is formed.

In this step, a photoresist is applied onto the interlayer insulating film 10, and etching is performed on the photoresist to give the photoresist pattern 11 which is used later to form via holes for contact with the wiring pattern 3*f* as the first wiring layer and the lower electrode pattern 3*d* of the capacitive element pattern 9.

Figure 6:
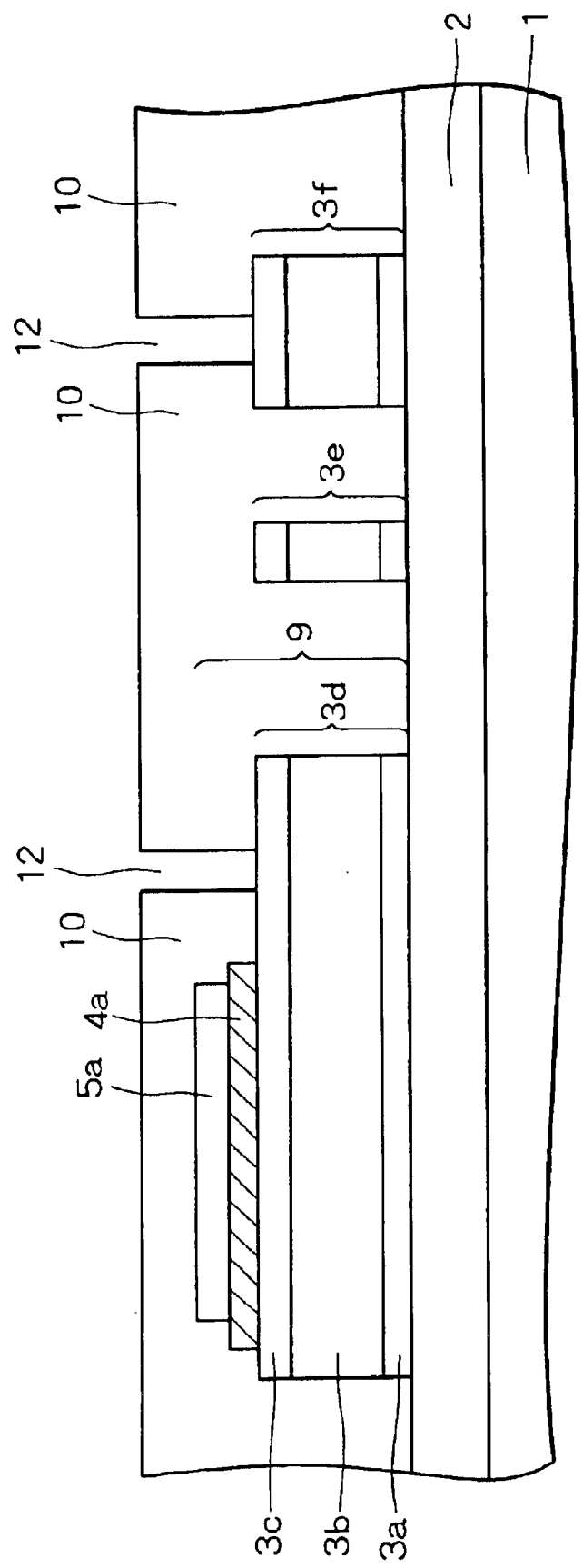
FIG. 6 is a sectional view showing the step following that in FIG. 5 in the production of a semiconductor device according to the method of the present invention.

FIG. 6 is a sectional view showing the step that follows the step shown in FIG. 5. In this step, the via holes 12 for wiring are formed.

In this step, etching is performed on the interlayer insulating film 10 by using the photoresist pattern 11 as a mask, so as to form the via holes 12 on the lower electrode 3*d* of the capacitive element pattern 9 and on the wiring pattern 3*f*. Subsequently, the photoresist pattern 11 is removed.

Figure 7:
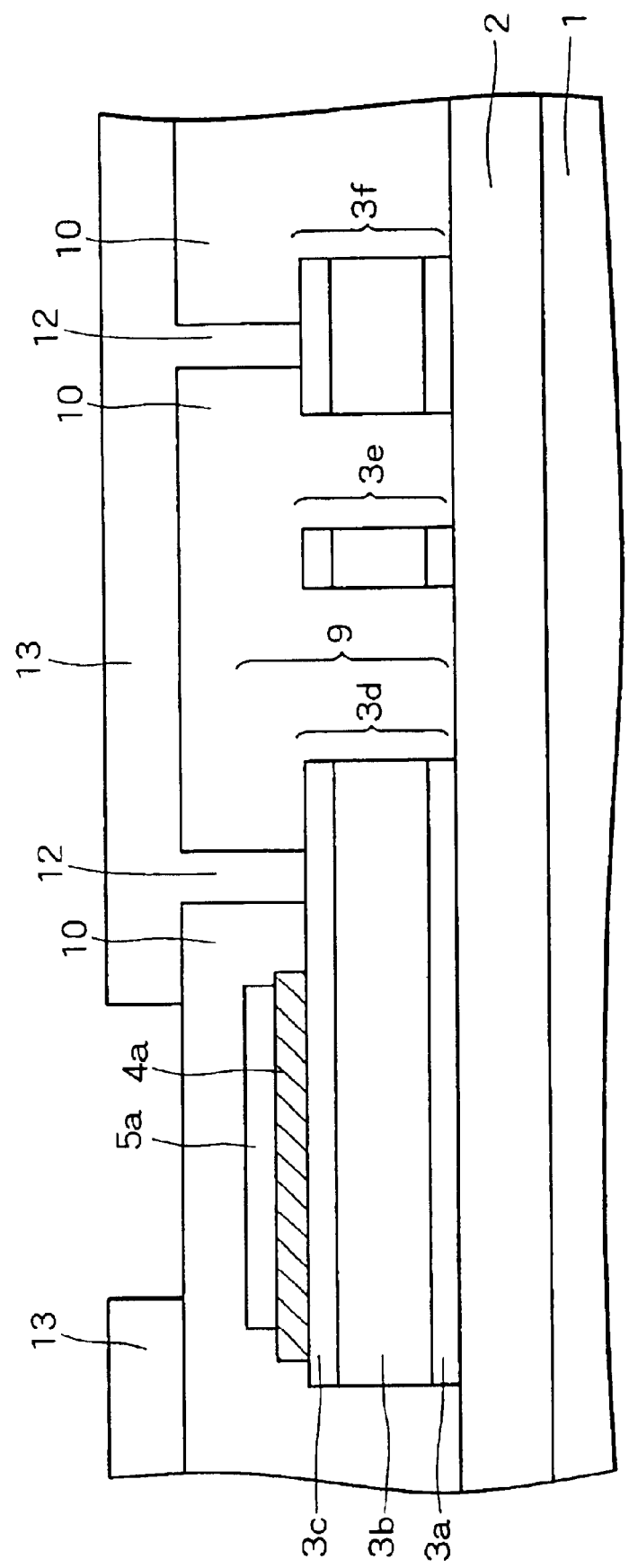
FIG. 7 is a sectional view showing the step following that in FIG. 6 in the production of a semiconductor device according to the method of the present invention.

FIG. 7 is a sectional view showing the step that follows the step shown in FIG. 6. In this step, the photoresist pattern 13 is formed, in which an opening is made above the upper electrode pattern 5*a* of the capacitive element pattern 9.

In this step, a photoresist is applied onto the interlayer insulating film 10 and the via holes 12. Etching is performed to form the photoresist pattern 13 which has an opening above the upper electrode pattern 5*a* of the capacitive element pattern 9.

Figure 8:
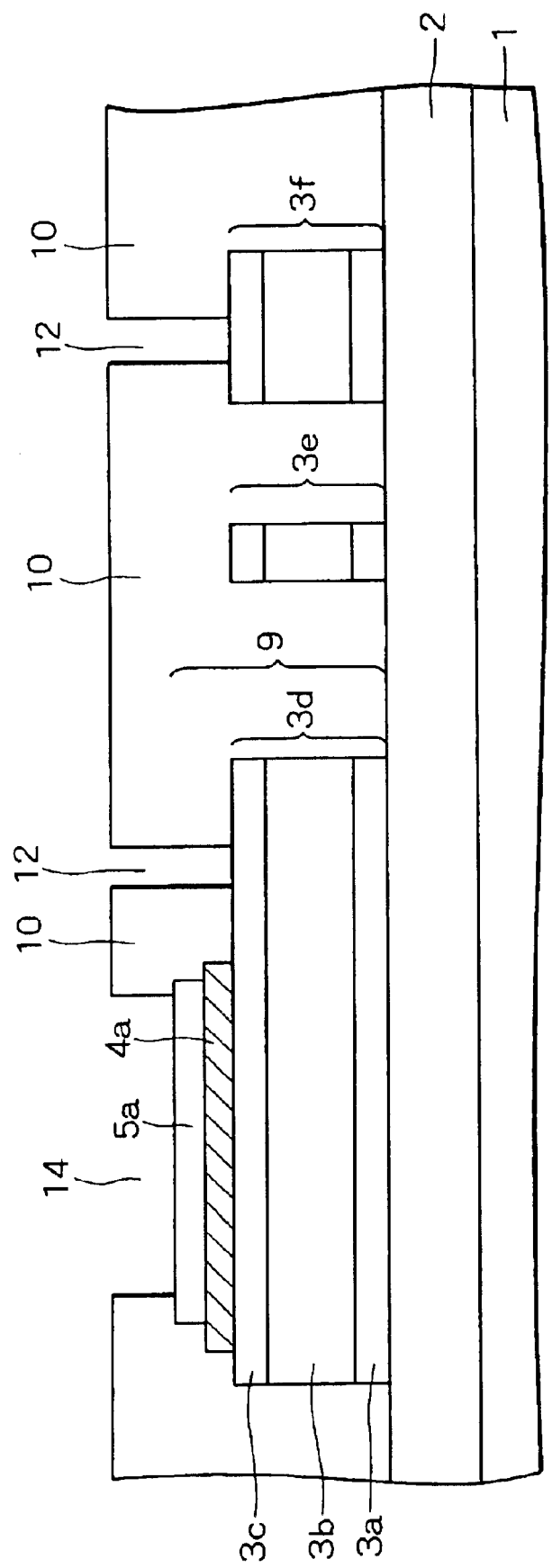
FIG. 8 is a sectional view showing the step following that in FIG. 7 in the production of a semiconductor device according to the method of the present invention.

FIG. 8 is a sectional view showing the step that follows the step shown in FIG. 7. In this step, the opening 14 on the upper electrode pattern 5*a* of the capacitive element pattern 9 is formed.

In this step, etching is performed by RIE or the like on the interlayer film 10 by using the photoresist pattern 13 as a mask, so as to form the opening 14. Subsequently, the photoresist pattern 13 is removed.

Figure 9:
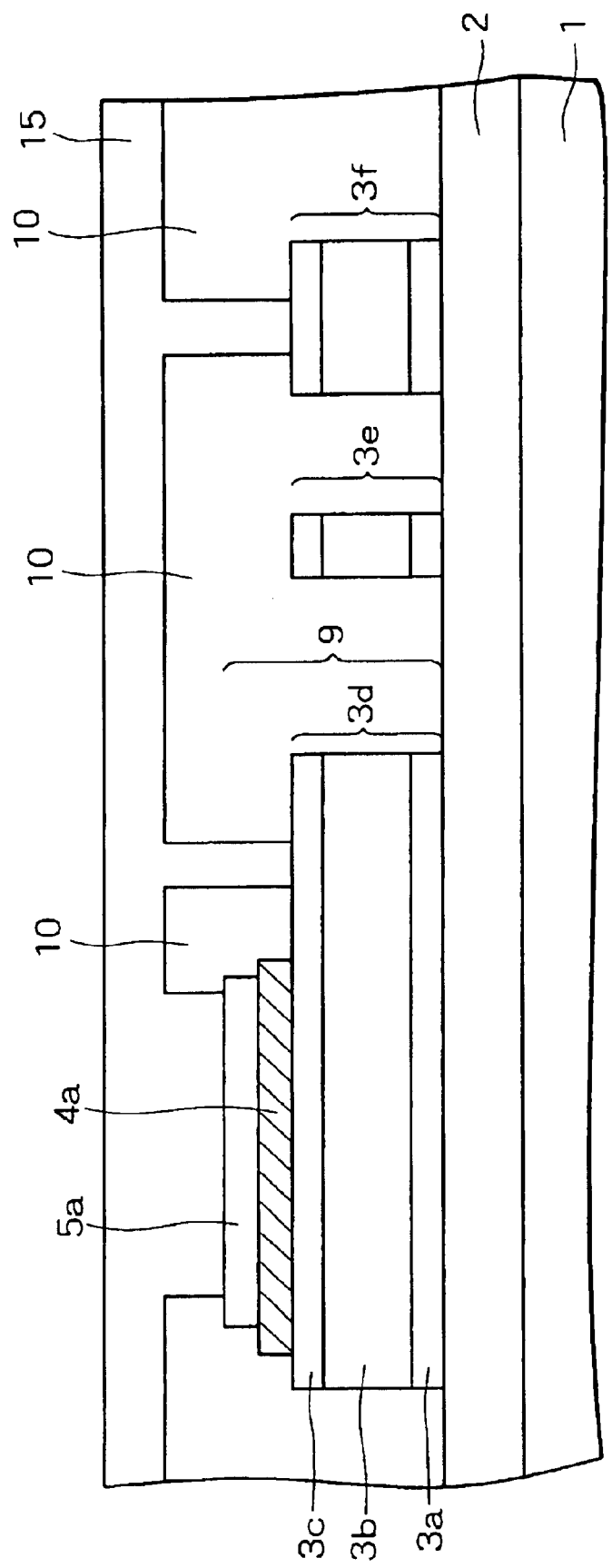
FIG. 9 is a sectional view showing the step following that in FIG. 8 in the production of a semiconductor device according to the method of the present invention.

FIG. 9 is a sectional view showing the step that follows the step shown in FIG. 8. In this step, the metal layer 15 as the second wiring layer is formed.

In this step, the metal layer 15, which is preferably 300 to 1000 nm thick, is formed on the insulating layer 2, the wiring pattern 3*f*, the capacitive element pattern 9, and the interlayer insulating film 10. The metal layer 15 functions as the wiring layer.

Figure 10:
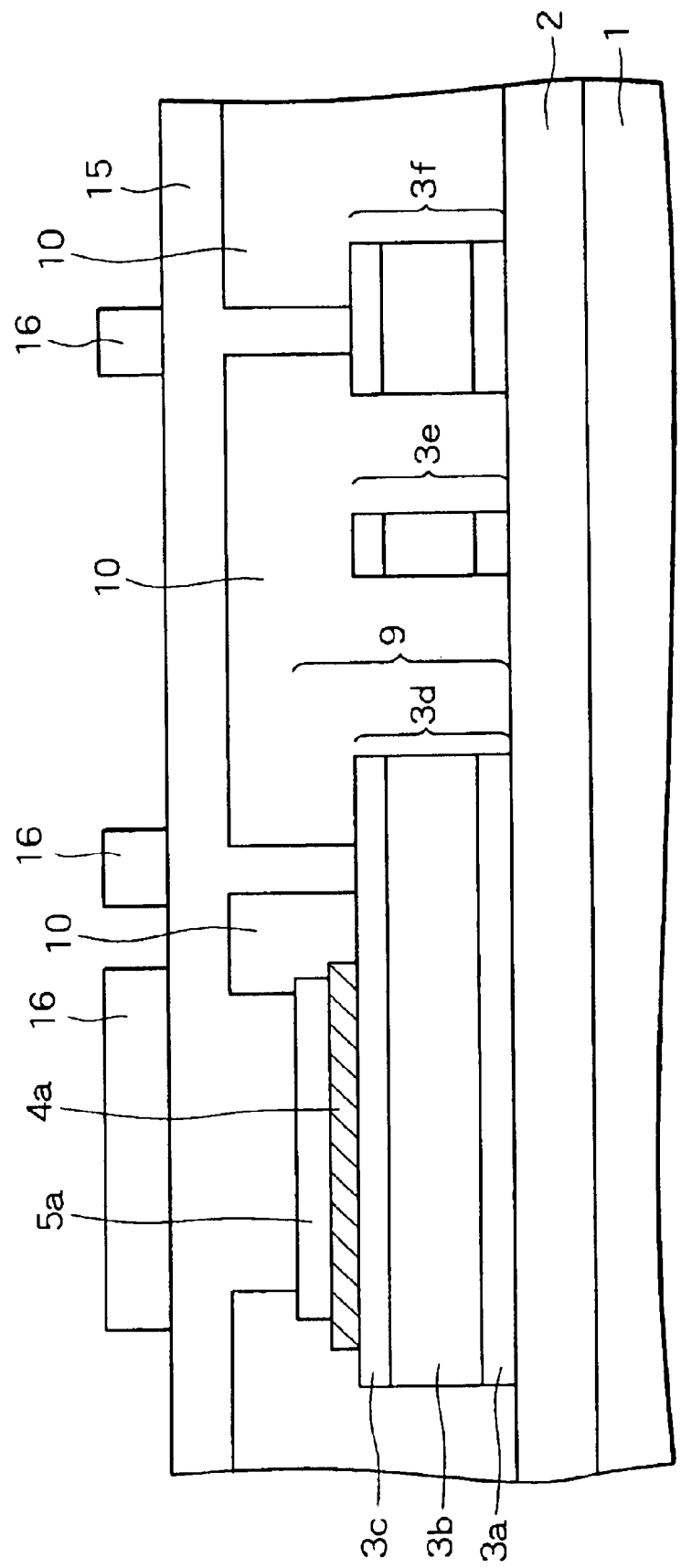
FIG. 10 is a sectional view showing the step following that in FIG. 9 in the production of a semiconductor device according to the method of the present invention.

FIG. 10 is a sectional view showing the step that follows the step shown in FIG. 9. In this step, the photoresist pattern 16, which serves to form the second wiring layer is formed.

In this step, a photoresist is applied onto the metal layer 15, and subsequently the photoresist undergoes etching to form the photoresist pattern 16.

Figure 11:
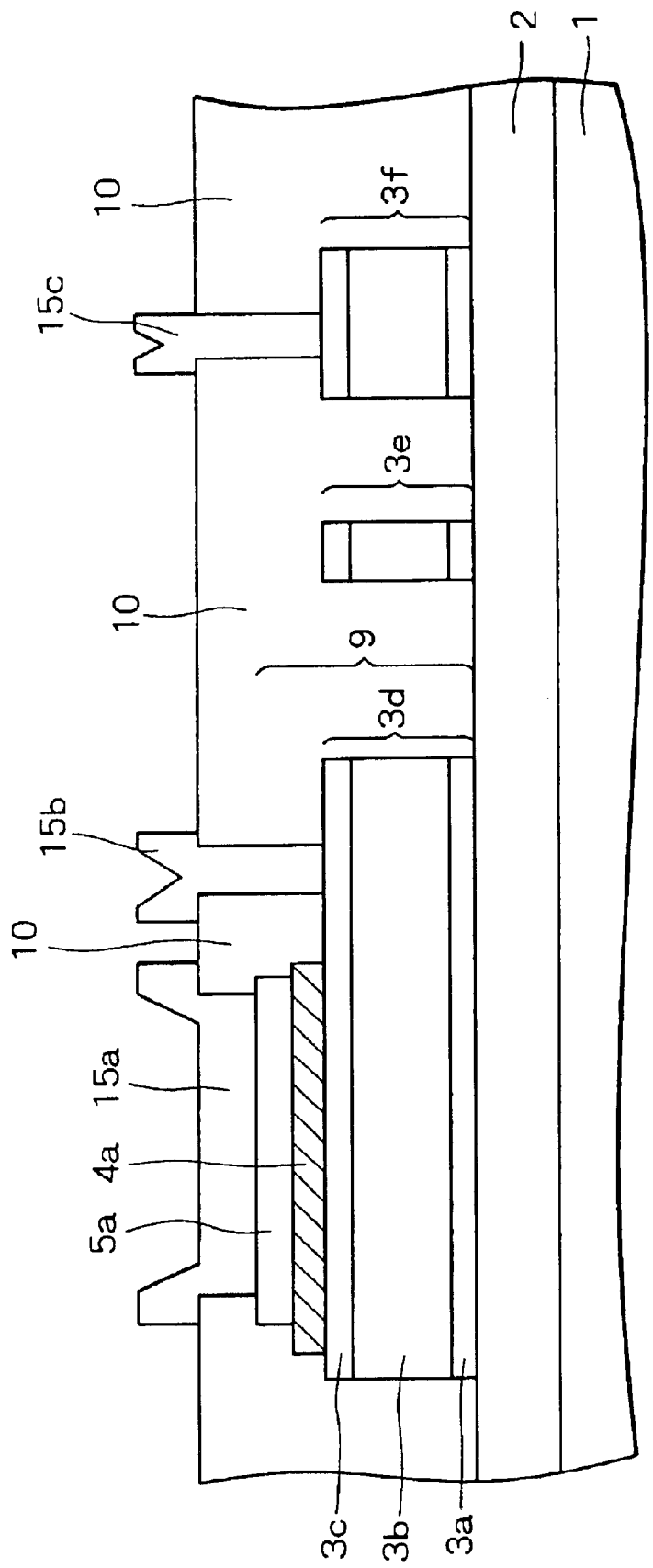
FIG. 11 is a sectional view showing the step following that in FIG. 10 in the production of a semiconductor device according to the method of the present invention.

FIG. 11 is a sectional view showing the step that follows the step shown in FIG. 10. In this step, the wiring patterns 15*a*, 15*b*, and 15*c* as the second wiring layer are formed.

In this step, etching is performed on the metal layer 15 by using the photoresist pattern 16 as a mask, so as to form the wiring pattern 15*a* for conduction to the upper electrode pattern 5*a*, the wiring pattern 15*b* for conduction to the lower electrode pattern 3*d*, and the wiring pattern 15*c* for conduction to the wiring pattern 3*f*.

Figure 12:
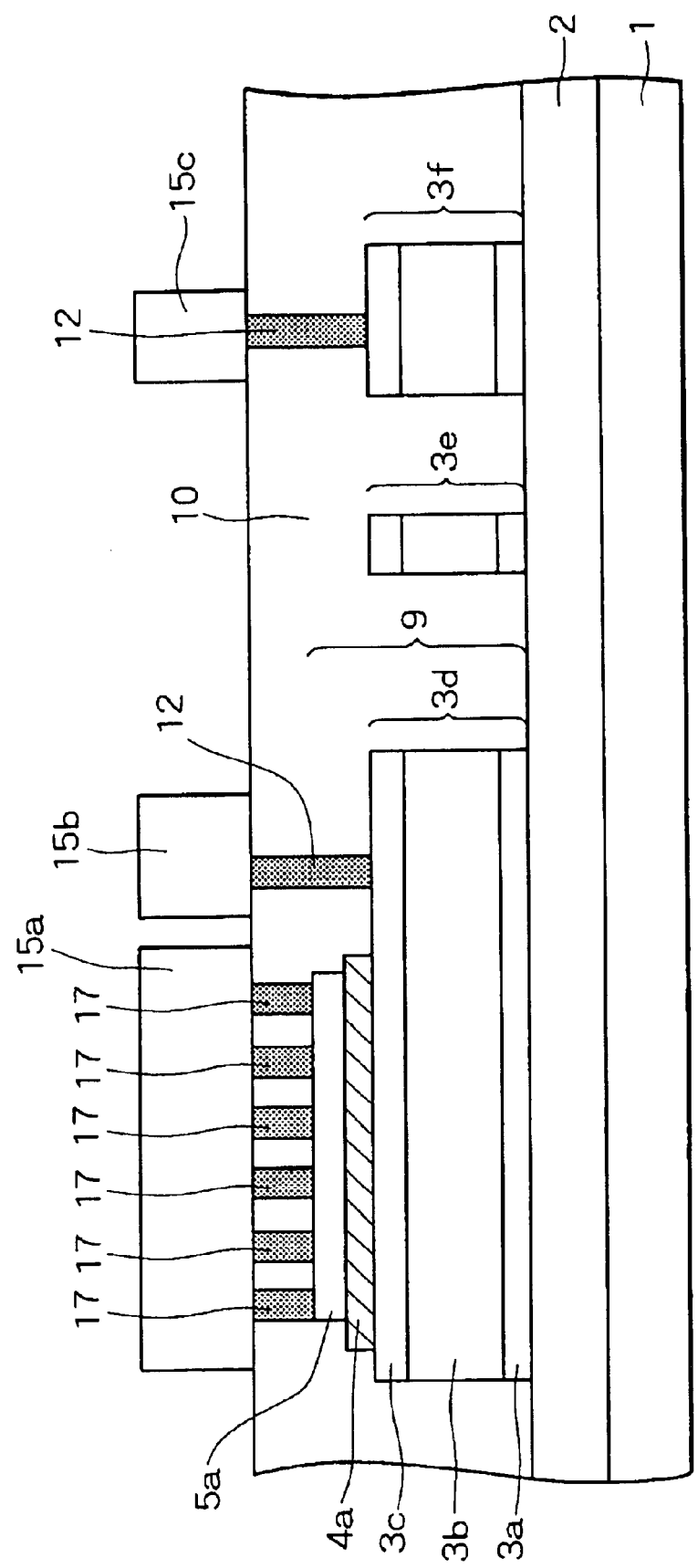
FIG. 12 is a sectional view showing the step of filling via holes with tungsten in the production of a semiconductor device according to the method of the present invention.
Figure 13A:
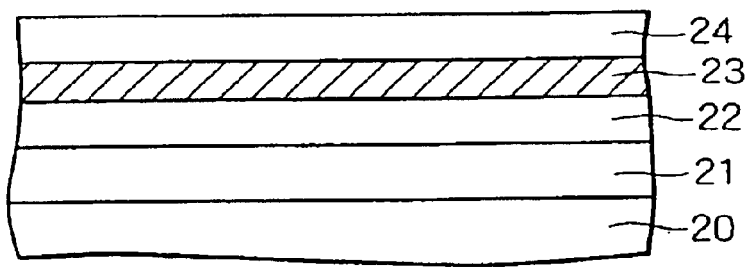
FIGS. 13A to 13C are sectional views showing step by step the conventional method for producing a semiconductor device with capacitive elements formed therein.
Figure 13B:
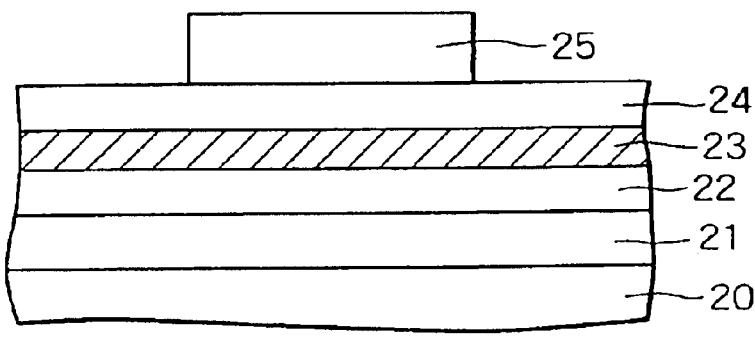
Figure 13C:
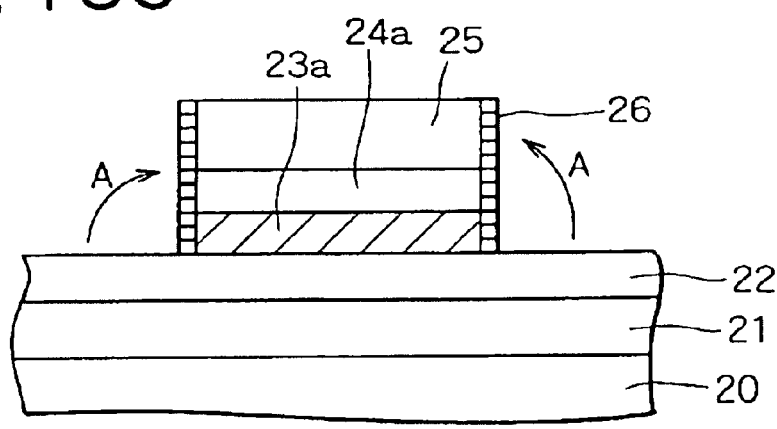

The step shown in FIG. 11 may be replaced by the step shown in FIG. 12. In this step, etching is performed on the interlayer insulating film 10 so as to form a via hole 12 and a plurality of via holes 17 on the upper electrode pattern 5*a* of the capacitive element pattern 9. These via holes 12 and 17 are filled with tungsten so that the wiring patterns 15*a*, 15*b*, and 15*c* as the second wiring layer conduct to the upper electrode pattern 5*a*, the lower electrode pattern 3*d*, and the wiring pattern 3*f*.

What is claimed is:

1. A method for production of a semiconductor device having capacitive elements comprising:

forming a lower electrode layer on an insulating layer;

forming a dielectric layer over said lower electrode layer;

forming an upper electrode layer over said dielectric layer;

forming a first pattern over said upper electrode layer;

etching said upper electrode layer by using said first pattern as a mask to form an upper electrode;

forming a second pattern which covers a top and side of said upper electrode, said second pattern being formed over wiring regions; and etching said dielectric layer by using said second pattern as a mask to form a bottom electrode of the capacitive elements and wiring elements.

2. A method for production of a semiconductor device as in claim 1, wherein said lower electrode layer is a metal laminate film including titanium nitride.

3. A method for production of a semiconductor device as in claim 1, wherein said dielectric layer is comprised of tantalum oxide.

4. A method for production of a semiconductor device as in claim 1, wherein said upper electrode layer is comprised of titanium nitride.

5. A method for production of a semiconductor device as in claim 1, wherein said first pattern and said second pattern are comprised of a resist.

6. A method for production of a semiconductor device as in claim 1, which further comprises forming a third pattern to form a lower electrode, where said third pattern covers said upper electrode and said dielectric layer, and thereafter etching said lower electrode layer by using said third pattern as a mask.

7. A method for production of a semiconductor device as in claim 6, wherein said third pattern is comprised of a resist.

8. A method for production of a semiconductor device as in claim 7, wherein the third pattern covers side walls of said upper electrode and said dielectric.

* * * * *